(12) United States Patent
Ha et al.

(10) Patent No.: US 9,489,914 B2
(45) Date of Patent: Nov. 8, 2016

(54) TRANSPARENT ELECTRODE LAMINATE AND TOUCH SCREEN PANEL INCLUDING THE SAME

(71) Applicant: DONGWOO FINE-CHEM CO., LTD., Jeollabuk-do (KR)

(72) Inventors: Kyoung Su Ha, Gyeonggi-do (KR); Gi Hwan Ahn, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 14/485,693

(22) Filed: Sep. 13, 2014

(65) Prior Publication Data

US 2016/0081183 A1    Mar. 17, 2016

(51) Int. Cl.
*G06F 3/044* (2006.01)
*G09G 5/00* (2006.01)
*H05K 1/02* (2006.01)

(52) U.S. Cl.
CPC .............. *G09G 5/003* (2013.01); *G06F 3/044* (2013.01); *H05K 1/0274* (2013.01); *G09G 2300/0426* (2013.01); *H05K 2201/0108* (2013.01); *H05K 2201/09781* (2013.01)

(58) Field of Classification Search
CPC ... G02F 1/1335; G02F 1/1337; G02F 1/1343
See application file for complete search history.

(56) References Cited

U.S. PATENT DOCUMENTS

2012/0146942 A1* 6/2012 Kamoshida ............. G06F 3/044
345/174

* cited by examiner

*Primary Examiner* — Shaheda Abdin
(74) *Attorney, Agent, or Firm* — The PL Law Group, PLLC

(57) ABSTRACT

Disclosed is a transparent electrode laminate including: sensing electrodes including first patterns formed in a first direction, and second patterns formed in a second direction; bridge electrodes configured to electrically connected separated unit patterns of the second patterns; and an insulation layer disposed between the sensing electrodes and the bridge electrodes, wherein metal patterns are formed on the insulation layer exposed between the first pattern and the second pattern, thereby obtaining a high transparency by minimizing a difference in reflectance for each position and reducing the pattern visual recognition.

15 Claims, 3 Drawing Sheets

TRANSPARENT ELECTRODE LAMINATE AND TOUCH SCREEN PANEL INCLUDING THE SAME

BACKGROUND OF THE INVENTION

1. Field of the Invention

The present invention relates to a transparent electrode laminate and a touch screen panel including the same, and more specifically, to a transparent electrode laminate with low pattern visual recognition and a touch screen panel having the transparent electrode laminate.

2. Description of the Related Art

Commonly, a touch screen is a screen equipped with a special input device to receive positional input by touching the screen with a finger of a user or a stylus pen. Such a touch screen does not use a keyboard, but has a configuration of multi-layer laminates wherein when the finger of the user or an object, such as a touch pen or a stylus pen, touches a specific character or position displayed on the screen. The touch screen identifies the position and directly receives data from the screen in order to practically process information at a specific position via software stored therein.

In order to recognize the touched position without degrading the visibility of an image displayed on the screen, it is necessary to use a transparent electrode in which sensing patterns are, in general, formed in a predetermined pattern.

As a transparent sensing electrode used in the touch screen panel, various structures are known in the related art. For example, a glass-ITO film-ITO film (GFF), a glass-ITO film (G1F), or a glass only (G2) structure may be used in the touch screen panel.

Among these, GFF is a commonly used structure and includes two transparent electrodes (viz., indium tin oxide, (ITO)) formed with two films required to implement X-axes and Y-axes. The G1F includes a first ITO thin film disposed on a rear surface of a glass and uses a film as a second ITO. G2 is a structure formed by a method depositing and patterning an ITO thin film for an X-axis on a rear surface of one reinforced glass, forming an insulation layer thereon, and pattering another ITO thin film for a Y-axis. Transmittance in the GFF, G1F, and G2 is increased while the power consumption is reduced, therefore, studies for the G2 structure are actively pursued.

However, in the G2 structure, which uses a patterned transparent electrode, a patterned portion and a non-patterned portion (i.e., pattern opening) of the transparent electrode may be visually distinct from each other. Accordingly, the bigger the difference in reflectance between the patterned portion and the non-patterned portion means the more distinctive the reflectance difference, and therefore, a decrease in the visibility of the appearance of a display element. In particular, in a capacitive-type touch panel, since patterned transparent electrodes are formed on the entire surface of the display unit of the display, even if the transparent electrode layer is patterned, the display device needs to have a good appearance.

In order to improve such a problem, for example, Japanese Patent Laid-open Publication No. 2008-98169 discloses a transparent conductive film in which an under coat layer including two layers with different refractive index is formed between a transparent substrate and a transparent conductive layer. In addition, as an embodiment of thereof, the above-described patent further discloses a transparent conductive file in which a silicon-tin oxide layer having a refractive index of 1.7 (with a thickness of 10 nm or more), a silicon oxide layer having a refractive index of 1.43 as a low refractive index layer (with a thickness of 30 nm), and an ITO film having a refractive index of 1.95 (with a thickness of 15 nm) are sequentially formed in this order.

However, since the difference in reflectance between the patterned portion and the non-patterned portion is clearly noticeable in the transparent conductive film disclosed in the above-described patent, there is still need for improvement of the appearance of the display device.

SUMMARY

Accordingly, in one embodiment, provided is a transparent electrode laminate with low pattern visual recognition due to small differences in reflectance for each position. In addition, in another embodiment, provided is a touch panel screen having the transparent electrode laminate.

Embodiments of the present invention will be described as having the following characteristics:

(1) A transparent electrode laminate including: sensing electrodes including first patterns formed in a first direction, and second patterns formed in a second direction; bridge electrodes configured to electrically connect separated unit patterns of the second patterns; and an insulation layer disposed between the sensing electrodes and the bridge electrodes, wherein metal patterns are formed on the insulation layer exposed between the first pattern and the second pattern.

(2) The transparent electrode laminate according to the above (1), wherein the metal pattern satisfies the following Equation 1:

$$0.99 \leq [(\text{Area ratio of metal pattern on insulation layer}) \times (\text{Total reflectance of metal pattern}) + (1-(\text{Area ratio of metal pattern on insulation layer})) \times (\text{Total reflectance of portion without metal pattern on insulation layer})/(\text{Total reflectance of sensing electrode and bridge electrode})] \leq 1.01 \quad \text{Equation 1}$$

wherein the total reflectance is a value of adding an interface (i.e., surface) reflectance to the respective reflectances.

(3) The transparent electrode laminate according to the above (1), wherein the metal pattern is formed of at least one metal selected from a group consisting of molybdenum, silver, aluminum, and copper.

(4) The transparent electrode laminate according to the above (1), wherein the metal pattern has a thickness of 20 to 300 nm.

(5) The transparent electrode laminate according to the above (1), wherein the bridge electrode electrically connects the second patterns through the contact holes formed in the insulation layer.

(6) The transparent electrode laminate according to the above (1), wherein the unit bridge electrode includes at least one bridge.

(7) The transparent electrode laminate according to the above (1), wherein the bridge of the unit bridge electrode has a width of 2 to 200 μm.

(8) The transparent electrode laminate according to the above (1), wherein the bridge electrode is formed of a material having higher electrical conductivity than the sensing electrode.

(9) The transparent electrode laminate according to the above (1), wherein the bridge electrode has a thickness of 20 to 200 nm.

(10) The transparent electrode laminate according to the above (1), wherein the bridge electrode is formed of the same material as the metal pattern.

(11) The transparent electrode laminate according to the above (10), wherein the bridge of the unit bridge electrode has a width of 2 to 20 μm.

(12) The transparent electrode laminate according to the above (1), wherein the sensing electrode and the bridge electrode are connected to a driving circuit through a position detecting line formed of the same material as the metal pattern.

(13) The transparent electrode laminate according to the above (1), further including a passivation layer on a face opposite to the face of the transparent electrode laminate on which a transparent substrate is adhered.

(14) The transparent electrode laminate according to the above (13), wherein the transparent substrate further includes at least one optical functional layer on a side opposite to a surface thereof on which the transparent electrode is formed.

(15) The transparent electrode laminate according to the above (14), wherein the optical functional layer is at least one layer of an antireflection layer and a pollution-preventing layer.

(16) A touch screen panel including the transparent electrode laminate according to any one of the (1) to (15).

According to the transparent electrode laminate of the present invention, the thickness of each layer included in the transparent electrode laminate is controlled to a predetermined range, thereby obtaining a high transparency by minimizing the difference in reflectance for each position and reducing the pattern visual recognition.

Due to the above-described aspects, when the transparent electrode laminate is applied to the touch screen panel of the G2 structure, the transparent electrode laminate may be useful via representing a high transmittance and low reflectance.

BRIEF DESCRIPTION OF THE DRAWINGS

The above and other embodiments, features and other aspects of the present invention will be more clearly understood from the following detailed description taken in conjunction with the accompanying drawings, in which.

DETAILED DESCRIPTION

The present invention discloses a transparent electrode laminate including: sensing electrodes including first patterns formed in a first direction, and second patterns formed in a second direction; bridge electrodes configured to electrically connect separated unit patterns of the second patterns; and an insulation layer disposed between the sensing electrodes and the bridge electrodes, wherein metal patterns are formed on the insulation layer exposed between the first pattern and the second pattern, thereby obtaining a high transparency by minimizing a difference in reflectance for each position and reducing the pattern visual recognition.

Hereinafter, some embodiments will be described to more concretely understand the present invention with reference to examples and comparative examples. However, those skilled in the art will appreciate that such embodiments are provided to further understand the spirit of the present invention and are not intended to limit the subject matter to be protected as disclosed in the instant detailed description and appended claims.

Figure 1:
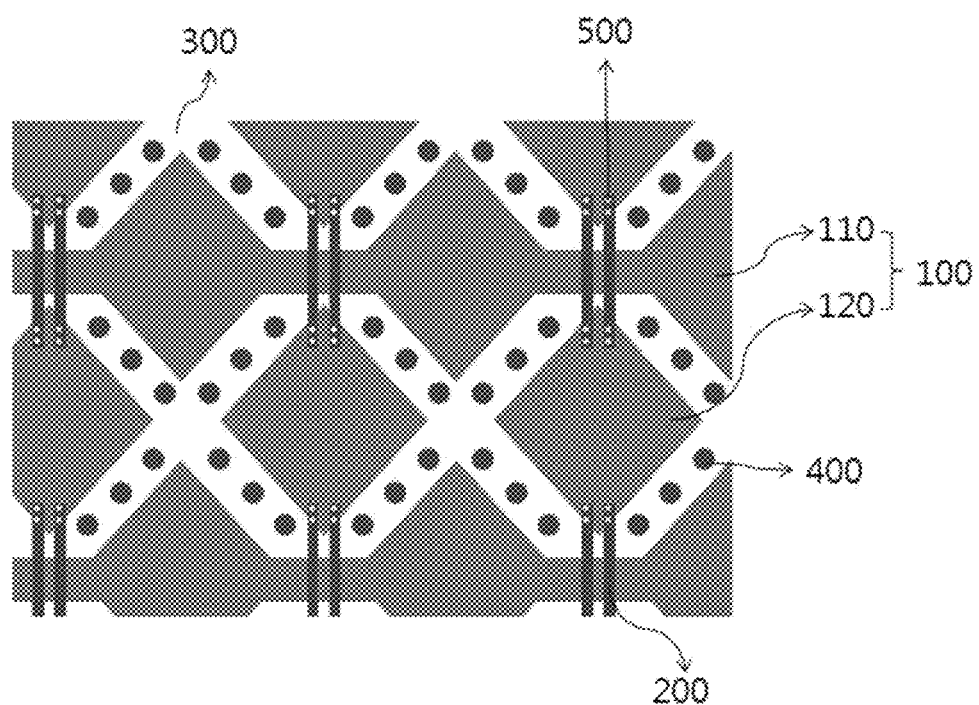
FIG. 1 is a schematic plan view illustrating a transparent electrode laminate according to an embodiment of the present invention.

FIG. 1 is a schematic plan view illustrating a transparent electrode laminate according to an embodiment of the present invention.

Referring to FIG. 1, the transparent electrode laminate of the present invention includes sensing electrodes 100, bridge electrodes 200, an insulation layer 300, and metal patterns 400. In addition, the transparent electrode laminate of the present invention may further include contact holes 500, and may be formed on a transparent substrate (see FIG. 3). Further, a passivation layer (see FIG. 3) may be provided on a face opposite to the face of the transparent electrode laminate on which the transparent substrate is adhered.

As illustrated in FIG. 1, the sensing electrodes 100 included in the transparent electrode laminate of the present invention are formed in a predetermined pattern to provide positional information on a point touched by a user with the bridge electrodes 200. The insulation layer 300 is disposed between the sensing electrodes 100 and the bridge electrodes 200 to electrically isolate them from each other. The metal patterns 400 are formed on the insulation layer 300 between first patterns 110 and second patterns 120 of the sensing electrodes 100 to decrease the visibility of the transparent electrode laminate of the present invention. The contact holes 500 may be formed in the insulation layer 300 to electrically connect the sensing electrodes 100 and the bridge electrodes 200.

Figure 3:
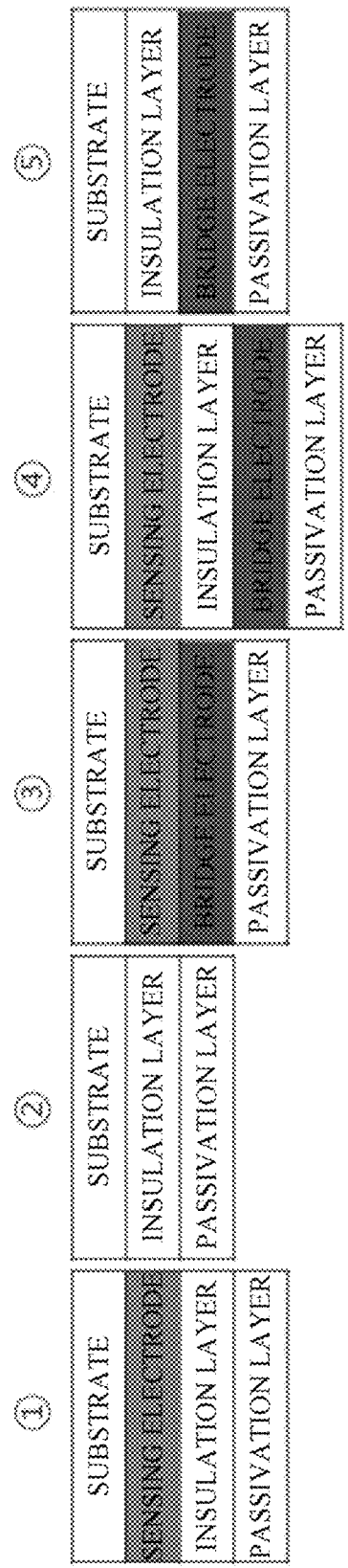
FIG. 3 is a schematic cross-sectional view illustrating laminated structures for each position of the transparent electrode laminate according to an embodiment of the present invention.

As illustrated in FIG. 3, since the transparent electrode laminate of the present invention may have various layered structures, a difference in reflectance, luminance, chrominance, or the like for each position may occur due to these various layered structures depending on positions thereof, and thereby undesirably increasing pattern visibility. Accordingly, there are limits to the transparent electrode functionality in conventional transparent electrode laminates due to increased pattern visibility.

Therefore, in order to solve the above-described problems, the transparent electrode laminate of the present invention includes metal patterns that are formed on regions between the sensing electrodes in the insulation layer. Therefore, it is possible to minimize the difference in reflectance between a pattern part and a non-pattern part of the sensing electrode. Hereinafter, the transparent electrode laminate according to the present invention will be described in more detail.

Transparent Electrode

In the present invention, the transparent electrode includes not only an electrode formed of a substantially transparent material, but also an electrode that may not be visually identified due to a narrowly formed structure thereof even if the material itself is not transparent.

Figure 2:
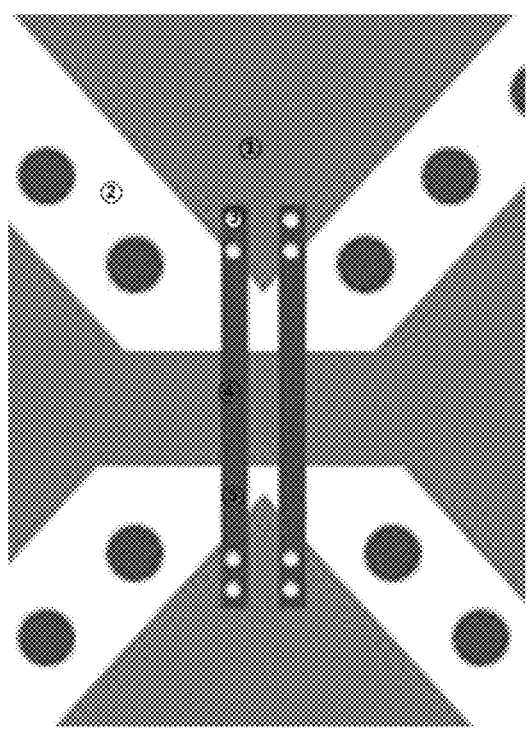
FIG. 2 is a schematic plan view illustrating a unit cell of the transparent electrode laminate according to an embodiment of the present invention.

As illustrated in FIGS. 1 to 3, the transparent electrode laminate according to one embodiment of the present invention includes the sensing electrodes 100 and the bridge electrodes 200.

The sensing electrode 100 may include first patterns 110 and second patterns 120. The first patterns 110 and second patterns 120 are disposed in different directions from each other so as to provide information on the X and Y coordinates of a position touched by the user. For example, these patterns are disposed in a same row or column direction, without limitation. Specifically, when the finger of the user or the object touches the transparent substrate, a change in capacitance depending on a contact position is detected and transferred to a driving circuit through the first and second patterns 110 and 120, the bridge electrodes 200, and metal wirings which are position detecting lines. Then, the change in capacitance is converted to an electrical signal by X and Y input processing circuits (not illustrated) to identify the contact position.

In this regard, the first pattern 110 and second pattern 120 have to be formed in the same layer of the transparent substrate, and the respective patterns have to be electrically connected to each other to detect the touched position. However, the first patterns 110 are connected with each other while the second patterns 120 are separated from each other in an island form, therefore, additional connection lines are needed to electrically connect the second patterns 120 with each other.

However, the connection lines should not be electrically connected to the first patterns 110, thus the connection lines have to be formed in a layer different from the sensing electrode 100. Accordingly, the bridge electrode 200 is formed in a separate layer different from the sensing electrode 100 to electrically connect the second patterns 120 with each other. That is, the bridge electrode 200 has a function of electrically connecting each of the second patterns 120 of the sensing electrode 100.

Therefore, in FIGS. 2 and 3, the positions of ①, ③ and ④ represent a portion in which the sensing electrode 100 is formed in a predetermined pattern to detect the touched region, respectively, and the positions of ③, ④ and ⑤ represent a portion in which the bridge electrode 200 is arranged to electrically connect the second patterns 120, which are separated in island form, respectively.

Herein, the bridge electrode 200 has to be electrically isolated from the first pattern 110 of the sensing electrode 100. Therefore, the transparent electrode laminate of the present invention includes the insulation layer 300 and the contact holes 500 (see ③ in FIG. 2), which will be described below.

The thickness of the sensing electrode and bridge electrode 100 and 200 is without limitation, but may be, for example, in the range of 20 to 200 nm, respectively. If the thickness of the sensing electrode and bridge electrode 100 and 200 is less than 20 nm, the electrical resistance may be increased and degrade the touch sensitivity. When the thickness thereof exceeds 200 nm, the reflectance may be increased and deteriorate the visibility.

Further, in one embodiment, the sensing electrode and bridge electrode 100 and 200 have a refractive index of 1.8 to 1.98. When these layers have a refractive index within the above-described range, reduction in reflectance may be improved.

Any conventional conductive material for forming the transparent electrode known in the related art may be used for the sensing electrode and bridge electrode 100 and 200, without limitation. For example, the conductive material for forming the transparent electrode may include indium-tin oxide (ITO), indium-zinc oxide (IZO), zinc oxide (ZnO), indium-zinc-tin oxide (IZTO), cadmium-tin oxide (CTO), poly(3,4-ethylenedioxythiophene) (PEDOT), carbon nanotube (CNT), metal wire, etc., which may be used alone or in combination with two or more thereof. In one embodiment, indium-tin oxide (ITO) is used. Metals used in the metal wire are without limitation and may include, for example, silver (Ag), gold (Au), aluminum (Al), copper (Cu), iron (Fe), nickel (Ni), titanium (Ti), tellurium (Te), chromium (Cr), etc., which may be used alone or in combination with two or more thereof.

In the present invention, the bridge means an electrode which is formed in a single line form of a unit bridge electrode, wherein the unit bridge electrode according to an embodiment of the invention may include at least one bridge.

The width of the bridge of the unit bridge electrode is without limitation and may include, for example, a range of 2 to 200 µm, or 2 to 100 µm. If the width of the bridge electrode is in the range of 2 to 200 µm, the visibility of the pattern may be decreased to provide favorable electrical resistance when the transparent electrode laminate of the present invention is applied to a touch screen panel.

The bridge electrode 200 may be more narrowly formed for being applied to the touch screen panel to decrease the width of a bezel. In this regard, the bridge electrode 200 may be formed of a material having higher electrical conductivity than the sensing electrode 100. When the bridge electrode 200 is formed of a material having higher electrical conductivity than the sensing electrode 100, the second patterns 120 of the sensing electrodes 100 may be electrically connected with each other by a smaller area.

If the width of the bridge is decreased, the electrical resistance may be increased. In this case, the bridge electrode according to an embodiment of the present invention may include at least two bridges as illustrated in FIG. 2. In this case, an increase in electrical resistance may be suppressed, and the area ratio of the bridge electrodes 200 per unit area may be reduced to decrease the visibility of the pattern part.

When the bridge electrode 200 is formed of a material having higher electrical conductivity than the sensing electrode 100, the bridge of the unit bridge electrode may have a width, for example, of 2 to 20 µm, or 2 to 5 µm, but is without limitation. When the bridge has a width of 2 to 20 µm, the visibility of the pattern may be decreased to provide favorable electrical resistance.

According to another aspect of the present invention, the bridge electrode 200 may be formed of the same material as the metal pattern 400 to be described below.

When the bridge electrode 200 is formed of the same material as the metal pattern 400, there is no need to execute an additional process for forming the metal patterns 400. In this case, the process may be more simplified by simultaneously forming the metal pattern 400 during forming the bridge electrode 200.

The sensing electrode and bridge electrode 100 and 200 may be formed by various thin film deposition techniques such as physical vapor deposition (PVD) or chemical vapor deposition (CVD) methods, or the like. The sensing electrode and bridge electrode 100 and 200 may be formed via a reactive sputtering, which is an example of the PVD method.

In addition, the sensing electrode and bridge electrode 100 and 200 may be formed via a printing process. To print transparent electrodes, various printing methods such as gravure off set printing, reverse off set printing, screen printing, gravure printing, etc., may be used during the printing process. In particular, when the sensing electrode and bridge electrode 100 and 200 are formed by the printing process, the transparent electrodes may be made of a printable paste material. As an example, these electrodes may be formed of a carbon nano tube (CNT), a conductive polymer, and Ag nanowire ink.

In the present invention, the laminating sequence of the sensing electrode 100 and the bridge electrode 200 is without limitation. Therefore, in another embodiment of the present invention, the lamination sequence of the sensing electrode 100 and the bridge electrode 200, illustrated in FIG. 3, may be changed. For example, the bridge electrode 200 is firstly formed on the transparent substrate instead of the sensing electrode 100, the insulation layer 300 is formed thereon, and then the sensing electrode 100 is formed on the insulation layer 300.

A method of forming the position detecting line, which connects the first patterns 110, the second patterns 120, and the bridge electrodes 200 to the driving circuit, is not without limitation. For example, the position detecting line may be formed by the same method as the method of forming the sensing electrode 100 and the bridge electrode 200.

In one embodiment, the position detecting line according to an embodiment of the present invention is formed of the same material as the metal patterns 400. In this case, there is no need to execute an additional process for forming the metal patterns 400. Therefore, the process may be more simplified by simultaneously forming the metal pattern 400 during forming the metal wiring and the position detecting line.

When all the bridge electrodes 200 and the position detecting line are formed of the same material as the metal patterns 400, all the position detecting lines and the metal patterns 400 may be simultaneously formed during formation of the bridge electrodes 200, such that an improvement in process efficiency may be greatly increased.

Insulation Layer and Contact Hole

The insulation layer 300 is formed between the sensing electrode 100 and the bridge electrode 200 to isolate the sensing electrode 100 from the bridge electrode 200 for preventing electrical connection therebetween. However, as illustrated in FIGS. 2 and 3, when the bridge electrode 200 electrically connects the adjacent second patterns 120 of the sensing electrode 100, since the bridge electrode 200 should be electrically connected with the sensing electrode 100, a portion on which the insulation layer 300 is not formed is needed. Commonly, in the region of the insulation layer 300, the portion on which the insulation layer 300 is not formed is referred to as the contact hole 500 (see ③ in FIG. 2). Accordingly, the second patterns 120 and the bridge electrode 200 are electrically connected with each other in the contact hole 500.

Any conventional insulation material known in the related art may be used for the insulation layer 300 without limitation. For example, the insulation layer 300 may be formed in a desired pattern using a metal oxide, such as silicon oxide, a transparent photosensitive resin composition including an acryl resin, or a thermosetting resin composition.

The insulation layer 300 may be formed on the sensing electrode 100, for example, using a deposition or printing method.

In the present invention, the contact holes 500 may be formed in such a way that the insulation layer 300 is wholly formed on the sensing electrode 100, and then a plurality of holes are formed in the insulation layer (i.e., hole method), or in a way that an insulation layer 300 is formed on the sensing electrode 100 except portions where the sensing electrode 100 and the bridge electrode 200 are electrically connected with each other (i.e., island method).

Metal Pattern

The metal patterns 400 are formed on the exposed insulation layer 300 between the first patterns 110 and the second patterns 120 to play a role of significantly decreasing a visibility of the transparent electrode laminate by reducing a difference in reflectance between the pattern part and the non-pattern part (i.e., pattern opening part) of the transparent electrode.

Specifically, when the pattern is formed of metal having high reflectance on the non-pattern part, the difference in reflectance with the pattern part of the transparent electrode is reduced, and thereby an observer may not recognize the difference in the reflectance therebetween.

The metal patterns 400 according to an embodiment of the present invention may be formed so as to satisfy the following Equation 1.

$$0.99 \leq [(\text{Area ratio of metal pattern on insulation layer}) \times (\text{Total reflectance of metal pattern}) + (1-(\text{Area ratio of metal pattern on insulation layer})) \times (\text{Total reflectance of portion without metal pattern on insulation layer})/(\text{Total reflectance of sensing electrode and bridge electrode})] \leq 1.01$$ Equation 1 wherein the total reflectance is a value of adding the interface (surface) reflectance to the respective reflectances.

When the area ratio and the reflectance of the metal patterns 400 satisfy a relation defined by Equation 1, the total reflected light of the pattern part and the non-pattern part of the transparent electrode is the same as each other, and therefore, the observer may not recognize the difference in reflectance between the pattern part and the non-pattern part of the transparent electrode. Therefore, a reduction in visibility of the transparent electrode laminate may be greatly increased.

The reflectance of the sensing electrode 100 and the bridge electrode 200 may be adjusted by properly selecting the thickness, reflectance, material of electrode, or the like of the sensing electrode 100 and the bridge electrode 200. Similarly, the reflectance of the metal patterns 400 may be adjusted by properly selecting the thickness, material, or the like thereof.

Any conventional metal known in the related art may be used for the metal patterns 400 according to an embodiment of the present invention, for example molybdenum (Mo), silver (Ag), aluminum (Al), and copper (Cu) etc., may be used. In one embodiment, molybdenum is used. These metals may be used alone or in combination with two or more thereof.

A thickness of the metal patterns 400 is without limitation and may be, for example, in the range of 20 to 300 nm, and in one embodiment 50 to 150 nm. When the thickness of the metal patterns 400 is in the range of 20 to 300 nm, reduction in visibility of the transparent electrode laminate may be greatly increased by providing an optimal level reflectance.

A method of forming the metal patterns 400 is without limitation, and may be, for example, by the same method as the method of forming the sensing electrode 100 and the bridge electrode 200.

Transparent Substrate

The transparent substrate is a part that forms an outermost surface of the touch screen panel and contacts with the finger of the user or the object. The transparent electrode laminate of the present invention is formed on a side opposite to a surface on which the finger of the user or the object contacts. As illustrated in FIG. 3, the transparent electrode laminate of the present invention is sequentially formed on the transparent substrate from the sensing electrode.

If necessary, the transparent electrode laminate of the present invention may further include a transparent dielectric layer between the transparent substrate and the sensing electrodes 100.

The transparent dielectric layer functions to decrease differences in optical properties due to structural differences at separate positions, and therefore, improves optical uniformity of the touch screen panel.

The transparent dielectric layer may be formed of niobium oxide, silicon oxide, cerium oxide, indium oxide, or the like, which may be used alone or in any combination with two or more thereof. The transparent dielectric layer may be easily deposited in a thin film form by using a vapor deposition method, sputtering, ion plating method, or the like.

In the present invention, a plurality of transparent dielectric layers are formed on the transparent substrate, if necessary. In this case, each of the plurality of transparent dielectric layers may be formed of different materials from each other and may have different refractive indexes and thicknesses from each other.

However, since the transparent electrode laminate of the present invention includes a metal pattern 500 formed therein, it is possible to decrease differences in optical properties due to structural differences on separate positions without forming the transparent dielectric layer, and thereby the transparent dielectric layer may be excluded.

The transparent substrate may be prepared of any material, if it has high durability to sufficiently protect the touch screen panel from external forces and allow a user to view the display very well, and any material for forming the transparent substrate used in the related art may be adopted without limitation. For example, glass, polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), cellulose acetate propionate (CAP), or the like, may be used. In one embodiment, glass is used and, in another embodiment, reinforced glass is used.

The transparent substrate according to an embodiment of the present invention may have a proper thickness, for example, 0.1 to 0.7 mm. When the transparent substrate has a thickness within the above-described range, reduction in reflectance of the transparent electrode laminate of the present invention may be improved.

In one embodiment, the transparent substrate has a refractive index of 1.4 to 1.6. When the transparent substrate has a refractive index within the above-described range, reduction in reflectance may be improved.

In the present invention, the transparent substrate may further include at least one optical functional layer on a side opposite to a surface thereof on which the transparent electrode is formed. The optical functional layer may be an antipollution layer such as an anti-reflection layer, an anti-fingerprinting layer, or the like, which may be used alone or in combination with two or more thereof.

Passivation Layer

In order to prevent the sensing electrode and bridge electrode 100 and 200 from being contaminated by exposing to an external environment (e.g., water, air, etc.), the transparent electrode laminate of the present invention may further include a passivation layer on a face opposite to the face of the transparent electrode laminate on which the transparent substrate is adhered, if necessary.

The passivation layer may be formed of any one selected from materials available in the insulation layer 300.

The passivation layer according to an embodiment of the present invention may have a proper thickness, for example, 2,000 nm or less, and specifically, 0 to 2,000 nm. When the passivation layer has a thickness within the above-described range, reduction in reflectance may be improved.

In one embodiment, the passivation layer has a refractive index of 1.4 to 1.6. When the passivation layer has a refractive index within the above-described range, reduction in reflectance may be improved.

Binder Layer

For adhering to a display panel part, the transparent electrode laminate of the present invention may include a binder layer. The binder layer is prepared by applying a transparent hardening resin composition and curing the same (OCR), or pressing a binder previously formed in a film shape onto the transparent electrode laminate (OCA).

The binder layer also may influence the reflectance of the transparent electrode laminate. Therefore, in order to reduce the reflectance of the transparent electrode laminate, in one embodiment the binder layer has a proper thickness and refractive index. For example, the binder layer may have a thickness of 0 to 250 μm and a refractive index of 1 to 1.6. When the binder layer has a thickness of 0 μm, the transparent electrode laminate has no binder layer, for example, the binder layer is not formed on a portion of the transparent electrode laminate to be actually displayed an image other than an edge portion on which the binder layer is formed. In this case, only an air gap is formed between the transparent electrode laminate and the display panel.

As described above, since the transparent electrode laminate of the present invention includes the metal patterns 400 formed on the region corresponding to between the sensing electrodes 100 in the insulation layer 300, it is possible to minimize the difference in reflectance between the pattern part and the non-pattern part of the transparent electrode, and significantly improve the transparency thereof. Accordingly, the transparent electrode laminate of the present invention may be prepared as a touch screen panel having excellent transparency by binding it to the display panel part.

Hereinafter, exemplary embodiments will be described to more concretely understand the present invention. However, it will be apparent to those skilled in the art that such embodiments are provided for illustrative purposes only, and various modifications and alterations may be possible without departing from the scope and spirit of the present invention.

EXAMPLE AND COMPARATIVE EXAMPLE

Transparent electrode laminates having a thickness illustrated in Table 1 below were fabricated in Examples 1 to 7 and Comparative Examples 1 to 4, respectively. Then, an average reflectance for each position and difference in average reflectance for regions ① and ② illustrated in FIG. 2 were measured, and the results thereof are shown in Table 1. Herein, the average reflectance means an average of the reflectance in a range of 400 nm to 700 nm.

A glass having a thickness of 0.7 mm (refractive index: 1.51, extinction coefficient: 0) as a transparent substrate, an ITO film (refractive index: 1.8, extinction coefficient: 0.014) as a sensing electrode, and an acrylic insulating material (refractive index: 1.51, extinction coefficient: 0) as an insulation layer and passivation layer were respectively used, and the reflectance and the extinction coefficient are shown in Table 1 based on a light having a wavelength of 550 nm.

Metal patterns were formed of molybdenum having a thickness of 50 nm or 150 nm.

Bridge electrodes were formed of: ITO film (refractive index: 1.8, extinction coefficient: 0.014) in Examples 1, 3 and 7, and Comparative Examples 1, 2 and 4; and molybdenum in other Examples and Comparative Examples.

Then, a bridge electrode, insulation layer and sensing electrode were sequentially formed in Examples 7 and 8, and Comparative Example 4; and a sensing electrode, insulation layer and bridge electrode were sequentially formed in other Examples and Comparative Examples.

Air in the binder layer of Table 1 means that the binder layer is not formed on a portion that is to display an image, and the binder layer is formed only on a bezel edge part.

TABLE 1

| Items | Sensing electrode | Insulation layer | Bridge electrode Thickness | Bridge electrode Width of unit bridge electrode | Bridge electrode The number of bridge in unit bridge electrode | Passivation layer | Binder layer | Area ratio of metal pattern in region ②(%) | Average reflectance (%) | Difference in reflectance (%) in regions ① and ② |
|---|---|---|---|---|---|---|---|---|---|---|
| Example 1 | 150 nm | 1,500 nm | 150 nm | 200 μm | 1 | 1,500 nm | Air | 2.3 | ①:9.3 ②:9.2 ③:9.6 ④:10.4 ⑤:9.8 | 0.1 |
| Example 2 | 250 nm | 1,500 nm | 50 nm | 10 μm | 2 | 1,500 nm | Air | 2.5 | ①:9.4 ②:9.3 Total average of ③,④,⑤:12.0 | 0.1 |
| Example 3 | 150 nm | 1,500 nm | 150 nm | 150 μm | 1 | 1,500 nm | Air | 2.3 | ①:9.3 ②:9.2 ③:9.6 ④:10.4 ⑤:9.8 | 0.1 |
| Example 4 | 150 nm | 1,500 nm | 150 nm | 10 μm | 2 | 1,500 nm | Air | 2.3 | ①:9.3 ②:9.2 Total average of ③,④,⑤:11.8 | 0.1 |
| Example 5 | 150 nm | 1,500 nm | 150 nm | 20 μm | 2 | 1,500 nm | Air | 2.3 | ①:9.3 ②:9.2 Total average of ③,④,⑤:14.9 | 0.1 |
| Example 6 | 150 nm | 1,500 nm | 150 nm | 5 μm | 1 | 1,500 nm | Air | 2.3 | ①:9.3 ②:9.2 Total average of ③,④,⑤:9.9 | 0.1 |
| Example 7 | 250 nm | 1,500 nm | 50 nm | 200 μm | 1 | 1,500 nm | Air | 2.5 | ①:9.4 ②:9.3 ③:9.6 ④:12.3 ⑤:10.3 | 0.1 |
| Comparative Example 1 | 150 nm | 1,500 nm | 150 nm | 200 μm | 1 | 1,500 nm | Air | — | ①:9.3 ②:8.1 ③:9.6 ④:10.4 ⑤:9.8 | 1.2 |
| Comparative Example 2 | 250 nm | 1,500 nm | 50 nm | 200 μm | 1 | 1,500 nm | Air | — | ①:9.4 ②:8.1 ③:9.6 ④:12.3 ⑤:10.3 | 1.3 |
| Comparative Example 3 | 150 nm | 1,500 nm | 150 nm | 200 μm | 1 | 1,500 nm | Air | — | ①:9.3 ②:8.1 Total average of ③,④,⑤:61.0 | 1.2 |
| Comparative Example 4 | 250 nm | 1,500 nm | 50 nm | 200 μm | 1 | 1,500 nm | Air | — | ①:9.4 ②:8.1 ③:9.6 ④:12.3 ⑤:10.3 | 1.3 |

To representatively describe Example 1 in Table 1, the reflectance of molybdenum and the reflectance of an outermost surface in region ② were measured to be 57% and 4%, respectively, and therefore, a total reflectance of the metal pattern was 61% (i.e., the same for both thicknesses of 50 nm and 150 nm). In addition, the total reflectance of a portion without the metal pattern on the insulation layer was measured to be 8.1%. The average reflectance in region ② was calculated using the measured values and the area ratio of the metal pattern. The reflectances of other Examples and Comparative Examples were measured by the same method as the Example 1.

In each region, since region ① that is the widest area gives the greatest effect on the visibility of the pattern and the effect of other regions is minimal, visibility of the pattern was compared by a difference in reflectance between regions ① and ②.

Referring to Table 1, due to the transparent electrode laminates prepared in Examples 1 to 7 having the metal patterns formed thereon, the difference in reflectance between regions ① and ② is only 0.1%, and therefore, the pattern was not exposed to the user.

However, for the transparent electrode laminates prepared in Comparative Examples 1 to 4, the difference in reflectance between regions ① and ② is significantly large, being 1.2% or 1.3%, and therefore, the pattern was exposed to the user.

What is claimed is:

1. A transparent electrode laminate, comprising:
   a sensing electrode including first patterns formed in a first direction and second patterns formed in a second direction;
   a bridge electrode to electrically connect separated unit patterns of the second patterns;
   an insulation layer disposed between the sensing electrode and the bridge electrode; and
   a metal pattern formed on the insulation layer exposed between the first pattern and the second pattern;
   wherein the metal pattern satisfies the following Equation 1:

0.99≤[[(Area ratio of the metal pattern on the insulation layer)×(Total reflectance of the metal pattern)+(1−(Area ratio of the metal pattern on the insulation layer))×(Total reflectance of portion without the metal pattern on the insulation layer)]/(Total reflectance of the sensing electrode and the bridge electrode)]≤1.01  [Equation 1]

wherein, the total reflectance is a value of adding an interface (surface) reflectance to the respective reflectances.

2. The transparent electrode laminate according to claim 1, wherein the metal pattern is formed of metal selected from the group consisting of molybdenum, silver, aluminum, copper, and a combination thereof.

3. The transparent electrode laminate according to claim 1, wherein the metal pattern has a thickness of 20 to 300 nm.

4. The transparent electrode laminate according to claim 1, wherein contact holes are formed in the insulation layer, and the bridge electrode electrically connects the second patterns through the contact holes.

5. The transparent electrode laminate according to claim 1, wherein the bridge electrode comprises unit bridge electrodes, and each unit bridge electrode includes at least one bridge.

6. The transparent electrode laminate according to claim 1, wherein the bridge of the unit bridge electrode has a width of 2 to 200 μm.

7. The transparent electrode laminate according to claim 1, wherein the bridge electrode is formed of a material having higher electrical conductivity than the sensing electrode.

8. The transparent electrode laminate according to claim 1, wherein the bridge electrode has a thickness of 20 to 200 nm.

9. The transparent electrode laminate according to claim 1, wherein the bridge electrode is formed of the same material as the metal pattern.

10. The transparent electrode laminate according to claim 9, wherein the bridge electrode comprises unit bridge electrodes, each unit bridge electrode includes at least one bridge, and the bridge of the unit bridge electrode has a width of 2 to 20 μm.

11. The transparent electrode laminate according to claim 1, wherein the sensing electrode and the bridge electrode are connected to a driving circuit through a position detecting line formed of the same material as the metal pattern.

12. The transparent electrode laminate according to claim 1, further comprising a passivation layer on a face opposite to the face of the transparent electrode laminate on which a transparent substrate is adhered.

13. The transparent electrode laminate according to claim 12, wherein the transparent substrate further comprises at least one optical functional layer on a side opposite to a surface thereof on which the transparent electrode is formed.

14. The transparent electrode laminate according to claim 13, wherein the optical functional layer comprises an anti-reflection layer, a pollution-preventing layer, or a combination thereof.

15. A touch screen panel comprising the transparent electrode laminate according to claim 1.

* * * * *